United States Patent [19]

Iwasaki et al.

[11] 4,412,239

[45] Oct. 25, 1983

[54] POLYSILICON INTERCONNECTS WITH PIN POLY DIODES

[75] Inventors: Hiroshi Iwasaki; Osamu Ozawa, both of Yokohama, Japan

[73] Assignee: Tokyo Shibaura Denki Kabushiki Kaisha, Kawasaki, Japan

[21] Appl. No.: 137,648

[22] Filed: Apr. 7, 1980

[30] Foreign Application Priority Data

Apr. 9, 1979 [JP] Japan .................... 54-42819

[51] Int. Cl.³ .............. H01L 27/10; H01L 23/52; H01L 29/04

[52] U.S. Cl. ................................... 357/44; 357/12; 357/58; 357/59; 357/67; 357/71; 357/92

[58] Field of Search .................... 357/59, 92, 71, 67, 357/44, 46, 86, 58

[56] References Cited

U.S. PATENT DOCUMENTS

| | | | |
|---|---|---|---|
| 3,015,762 | 1/1962 | Shockley | 357/20 |
| 4,041,518 | 8/1977 | Shimizu et al. | 357/235 |
| 4,041,522 | 8/1977 | Oguey et al. | 357/42 |
| 4,074,304 | 2/1978 | Shiba | 357/59 R |
| 4,148,055 | 4/1979 | Edlinger et al. | 357/59 R |
| 4,160,989 | 7/1979 | de Brebisson et al. | 357/59 R |
| 4,161,745 | 7/1979 | Slob | 357/59 R |
| 4,227,203 | 10/1980 | Milcoshiba | 357/59 R |
| 4,229,757 | 10/1980 | Moussie | 357/59 R |
| 4,333,099 | 1/1982 | Tanguay et al. | 357/86 |
| 4,353,085 | 10/1982 | Sakurai | 357/59 |

FOREIGN PATENT DOCUMENTS

| | | | |
|---|---|---|---|
| 51-40866 | 4/1976 | Japan | 357/59 R |
| 2024512 | 1/1980 | United Kingdom | 357/59 R |

OTHER PUBLICATIONS

Okada et al, IEEE J. of Solid-State Circuits, vol. SC 13, No. 5, Oct. 1978, pp. 693-698.

Mikoshiba, IEEE J. of Solid-State Circuits, vol. SC 13, No. 4, Aug. 1978, pp. 483-489.

Berger et al, IBM Technical Disclosure Bulletin, vol. 21, No. 12, May 1979, p. 4886.

Jaeger et al, IBM Technical Disclosure Bulletin, vol. 19, No. 10, Mar. 1977, pp. 3942-3946.

*Primary Examiner*—William D. Larkins
*Attorney, Agent, or Firm*—Finnegan, Henderson, Farabow, Garrett & Dunner

[57] ABSTRACT

A semiconductor device comprising a semiconductor substrate, a plurality of IIL gates formed in the substrate, each consisting of an inverter transistor and an injector transistor, and polysilicon films of P and N conductivity types connected to each other and formed as electrode layers connected with diffusion layers of P and N conductivity types which are formed on the substrate, respectively.

4 Claims, 23 Drawing Figures

POLYSILICON INTERCONNECTS WITH PIN POLY DIODES

BACKGROUND OF THE INVENTION

This invention relates to a semiconductor device comprising a plurality of bipolar transistors.

As the packing density of a semiconductor integrated circuit is increased, the electrodes of the circuit occupy more area. To further increase the packing density, it is necessary to reduce the area occupied by the electrodes. The packing density of MOS integrated circuit is improved by using impurity-doped polysilicon films as at least gate electrodes. A polysilicon film gate, which is generally known as "silicon gate", can easily be formed in a multilayer structure, thus providing a great latitude of design.

Polysilicon films are seldom used for electrodes in a bipolar integrated circuit. In this specification electrode means also interconnection. Aluminum films are used because a bipolar device differes from a MOS device in an operation mechanism and the structure. First, electric currents flow through the emitter, base and collector of the bipolar device, whereas no gate current flows through the MOS device. Secondly, the bipolar device has diffusion layers of both conductivity types, i.e. diffusion layers of P type and diffusion layers of N type. By contrast, the MOS device has diffusion layers of only N type if it is an N-channel device or diffusion layers of only P type if it is a P-channel device.

Since a base current flows through it, the bipolar device must have low resistance base electrodes. Otherwise it would fail to operate. Therefore the electrodes are generally aluminum films, not polysilicon films. On the other hand, since no gate current flows through it, the MOS device may have relatively high resistance gate electrodes. This is why polysilicon films which have a higher resistance than aluminum films are used for gate electrodes in an MOS device.

Since the bipolar device has diffusion layers of both conductivity types, PN junction would be formed in many cases between the P diffusion layers and the N diffusion layers if the electrodes are made of polysilicon. If such PN junctions are formed, the bipolar device will cease to function. This problem does not occur in the MOS device whose diffusion layers are of either P type or N type.

It is difficult, however, to form a multilayer structure of aluminium films. Further it is difficult to arrange aluminum films in the desired pattern. Therefore in the known bipolar device, aluminum films are so arranged as to provide so-called "single layer electrodes". The bipolar devices cannot have their packing density improved.

Integrated injection logic gates (IIL gates) are well-known bipolar devices. IIL gates are popular because they are logic gates which have a low power consumption. An IIL gate comprises an upwards vertical transistor for an inverter and a transistor for an injector. The injector transistor is complimentary to the inverter transistor and applies a load on the base of the inverter transistor. The injector transistor is a lateral transistor, whose collector and base are respectively the base and emitter of the inverter transistor. The electrodes of the IIL gates are aluminum films. Until now it has not been through possible to construct IIL gates whose electrodes are made of polysilicon. As mentioned above, as it is difficult to form aluminum films one upon another, the packing density of the IIL gates cannot be increased.

When closely studied, an IIL gate is found to possess the following characteristic features. First, its logic amplitude is small, and its operating current is extremely small. Secondly, in the electrode connecting a P layer of one IIL gate and an N layer of another IIL gate, current flows always from the P layer to the N layer. The IIL gate has such a structure as shown in FIG. 1 which is a cross sectional view.

Figure 1:
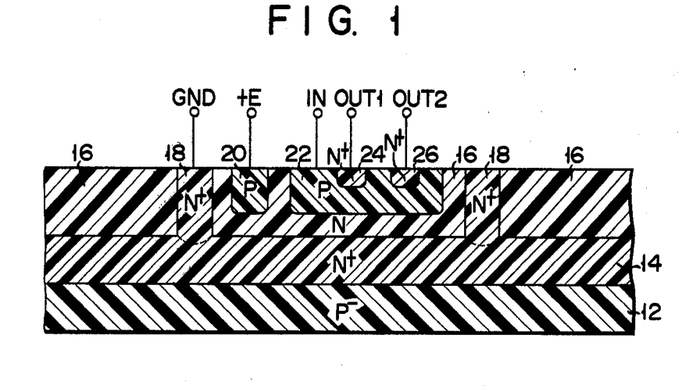
FIG. 1 is a cross sectional view of an IIL gate.

As shown in FIG. 1, a buried N+ layer 14 is formed on a P− substrate 12. On the substrate 12 and the buried N+ layer 14 an N epitaxial layer 16 is formed. Formed in the N epitaxial layer 16 is an N+ diffusion layer 18 which contacts the busied N+ layer 14. Two P diffusion layers 20 and 22 are formed in that portion of the N epitaxial layer 16 which is laid on the N+ layer 14. In the P diffusion layer 22 two N+ diffusion layers 24 and 26 are formed. The N+ diffusion layer 18 is connected to the ground GND, and the P diffusion layer 20 is connected to a power source voltage +E. The P diffusion layer 22 is connected to an input terminal IN. The N+ type diffusion layers 24 and 26 are connected to output terminals $OUT_1$ and $OUT_2$, respectively.

Figure 2:
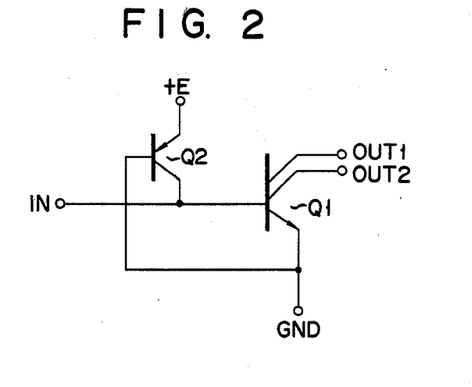
FIG. 2 shows an equivalent circuit of the IIL gate shown in FIG. 1.
Figure 3:
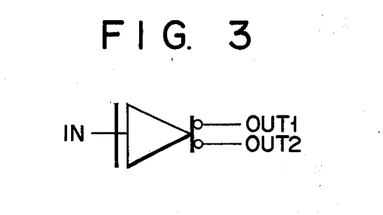
FIG. 3 is a symbol of the IIL gate shown in FIG. 1.

FIG. 2 is an equivalent circuit diagram of the IIL gate shown in FIG. 1. An NPN vertical transistor $Q_1$ for an inverter consists of the N layer 16 which serves as an emitter, the P layer 22 which serves as a base and the N+ layers 24 and 26 which serve as collectors. A PNP lateral transistor $Q_2$ consists of the P layer 20 which serves as an emitter, the N layer 16 which serves as a base and the P layer 22 which serves as a collector. The IIL gate may be represented by such a symbol as shown in FIG. 3. Then, a T type flip-flop comprised of IIL gates will be illustrated in FIG. 4.

Figure 4:
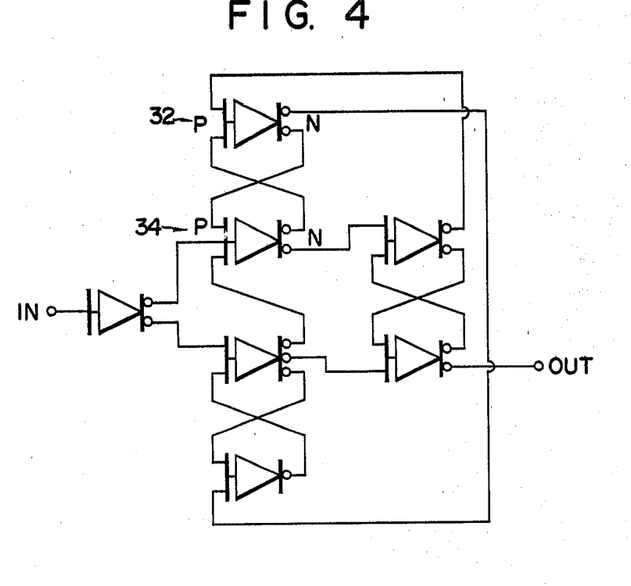
FIG. 4 is a circuit diagram of a known T type flip-flop in which the symbol shown in FIG. 3 is used.

As shown in FIG. 4, to connect the input terminal (i.e. P layer) of, for example, an IIL gate 32 to the output terminal (i.e. N layer) of the adjacent IIL gate 34, an electrode is necessary. Now, current flow in such electrodes of an integrated circuit which comprises IIL gates will be discussed, and reference will be made to FIG. 5.

Figure 5:
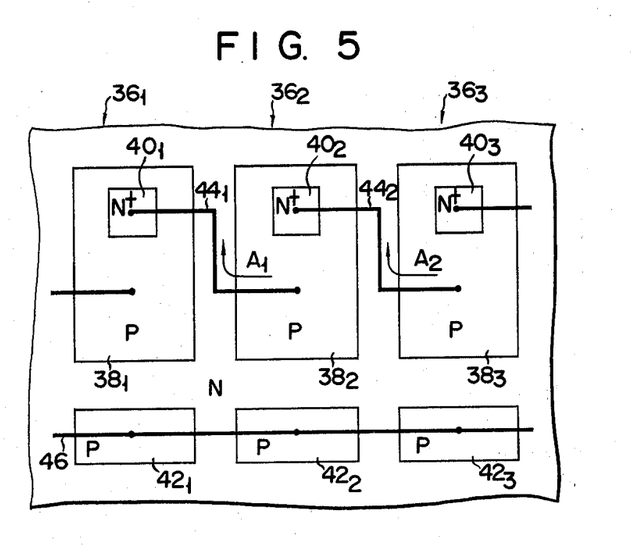
FIG. 5 is a schematical plan view of a portion of a semiconductor device including IIL gates and electrode films connecting the IIL gates.

FIG. 5 is a schematical plan view of an integrated circuit comprising a plurality of IIL gates, of which only three, i.e. IIL gates $36_1$, $36_2$ and $36_3$, are illustrated. Electrodes connecting these IIL gates $36_1$, $36_2$ and $36_3$ are also shown in FIG. 5. The IIL gate $36_1$ has a P layer $38_1$, an N+ layer $40_1$ and a P layer $42_1$. Similarly, the IIL gate $36_2$ has a P layer $38_2$, an N+ layer $40_2$ and a P layer $42_2$, and the IIL gate $36_3$ has a P layer $38_3$, an N+ layer $40_3$ and a P layer $42_3$. The P layers $38_1$, $38_2$ and $38_3$ are each the base (i.e. signal input terminal) of an inverter transistor. The N+ layers $40_1$, $40_2$ and $40_3$ are each the collector (i.e. signal output terminal) of the inverter transistor. The P layers $42_1$, $42_2$ and $42_3$ are each the emitter of an injector transistor. They are generally called "injectors". Hereinafter they will be called "injector P layers".

An electrode film $44_1$ is formed and connects the N+ layer $40_1$ of the IIL unit $36_1$ to the P layer $38_2$ of the IIL gate $36_2$. Likewise, an electrode film $44_2$ is formed and connects the N+ layer $40_2$ of the IIL gate $36_2$ to the P layer $38_3$ of the IIL gate $36_3$. Further provided is an electrode film 46 which connects the injector P layer $42_1$ of the IIL gate $36_1$, the injector P layer $42_2$ of the IIL gate $36_2$ and the injector P layer $42_3$ of the IIL gate $36_3$.

As long as the inverter transistor of the IIL gate $36_1$ is conductive, its base current flows from the injector P layer $42_1$ and its collector current flows through the base (i.e. P layer $38_2$) of the inverter transistor of the next IIL gate $36_2$. The inverter transistor of the IIL gate $36_2$ still remains non-conductive. When the inverter transistor of the IIL gate $36_2$ is rendered conductive, its collector current flows through the base (i.e. P layer $38_3$) of the IIL gate $36_3$. That is, in the electrode film $44_1$ connecting the N+ layer $40_1$ to the P layer $38_2$ current flows in the direction of arrow $A_1$, from the P layer $38_2$ to the N+ layer $40_1$. And in the electrode film $44_2$ connecting the N+ layer $40_2$ to the P layer $38_3$ current flows in the direction of arrow $A_2$, from the P layer $38_3$ to the N+ layer $40_2$.

SUMMARY OF THE INVENTION

This invention is based on the fact that current flows in specific directions in a semiconductor device which includes a plurality of bipolar transistors such as IIL gates. The object of the invention is to provide a semiconductor device which comprises a plurality of bipolar transistors and whose packing density is increased by using polysilicon films as electrodes.

According to this invention a semiconductor device is provided, which comprises a semiconductor substrate, an integrated circuit of a plurality of bipolar transistors formed in the substrate, each transistor including a diffusion layer of P conductivity type and a diffusion layer of N conductivity type, and polysilicon films of P and N conductivity types formed as electrodes connected with the diffusion layers of P and N conductivity types, respectively.

Further, this invention provides a method of manufacturing a semiconductor device which comprises a step of forming a metal layer of a high melting point on the all of the semiconductor surfaces including an insulation layer and P and N polysilicon films, both the insulation layer and the polysilicon films being formed on a semiconductor substrate and the P and N polysilicon films being connected to each other, a step of heating the metal layer to form a silicide of the metal on the P and N polysilicon films, and a step of removing by an aqua regia boiling process that portion of the metal layer which is formed on the insulation layer so that only the silicide of the metal formed on the polysilicon films is left in a self-aligned process.

DETAILED DESCRIPTION OF THE PREFERRED EMBODIMENTS

Figure 6:
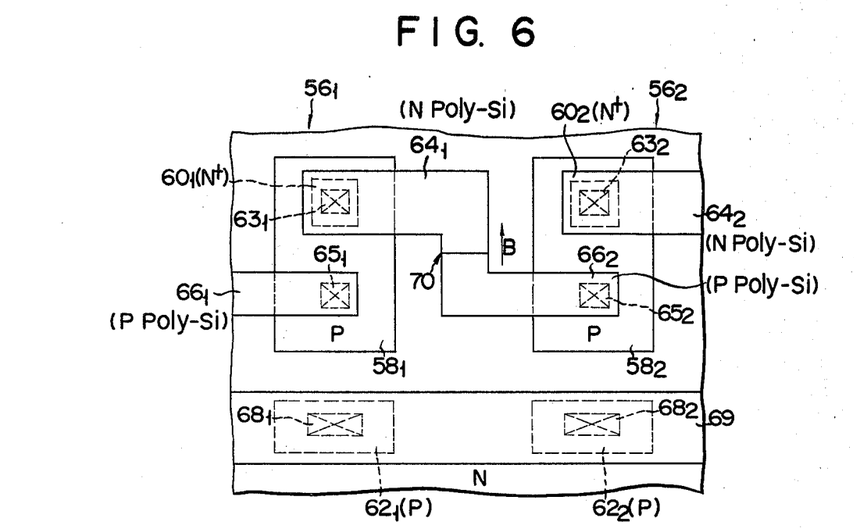
FIG. 6 is a schematical plan view of a portion of a semiconductor device according to this invention.

FIG. 6 is a schematical plan view of a portion of a semiconductor device according to this invention, which comprises a plurality of IIL gates. In FIG. 6 only two IIL gates $56_1$ and $56_2$ are shown for simplicity's sake. A P layer $58_1$ and an N+ layer $60_1$ are respectively the base and collector of the inverter transistor of the IIL gate $56_1$. Similarly, a P layer $58_2$ and an N+ layer $60_2$ are respectively, the base and collector of the inverter transistor of the IIL gate $56_2$. P layers $62_1$ and $62_2$ are respectively the emitters of the injector transistors of the IIL gates $56_1$ and $56_2$. The base layers $58_1$ and $58_2$ are signal input terminals and the collector layers $60_1$ and $60_2$ are signal output terminals. The P layers $62_1$ and $62_2$ are generally called "injectors" and will hereinafter be called "injector P layers".

Further provided are electrode films $64_1$ and $64_2$ which are made of N polysilicon and electrode films $66_1$ and $66_2$ which are made of P polysilicon. The electrode films $64_1$ and $64_2$ contact the N+ layers $60_1$ and $60_2$ through contact holes $63_1$ and $63_2$, respectively. The electrode films $66_1$ and $66_2$ contact the P layers $58_1$ and $58_2$ through contact holes $65_1$ and $65_2$, respectively. Further, another electrode film 69 made of P polysilicon is provided. The film 69 contacts the injector P layers $62_1$ and $62_2$ through contact holes $68_1$ and $68_2$, respectively.

Between every semiconductor layer and every polysilicon film an insulation film of, for example, $SiO_2$ is formed. The insulation film is not illustrated in FIG. 6 for simplicity's sake though.

To connect the N+ layer $60_1$ of the IIL gate $56_1$ to the P layer $58_2$ of the IIL gate $56_2$, the N polysilicon film $64_1$ and the P polysilicon film $66_2$ are connected to each other. These films $64_1$ and $66_2$ therefore form a PN junction. As mentioned above, in a PN junction of two IIL gates current flows always in the forward direction, never in the reverse direction. Likewise, in the PN junction formed of the polysilicon films $64_1$ and $66_2$ current flows in the forward direction as indicated by arrow B. Therefore, if the forward voltage drop across the PN junction is smaller than the base-emitter voltage of the inverter NPN transistor, the PN junction does not adversely affect the operation of the semiconductor device. Further, as experimentally known, the forward voltage across the PN junction is smaller than the forward voltage across a PN junction formed of two single-crystalline silicon films.

The semiconductor device of FIG. 6 has a small logic amplitude and an extremely small power consumption. Therefore, its electrode films, though made of polysilicon whose specific resistance is higher than that of aluminum, very little affects the operation of the device. Since its electrode films are made of polysilicon, the semiconductor device may have a multilayer structure, may provide a great lastitude of design and may therefore has its packing density improved.

Figure 7A:
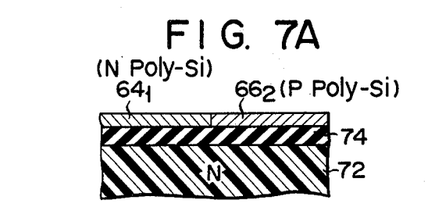
FIGS. 7A and 7B illustrate the connection of P and N polysilicon films in the device shown in FIG. 6.
Figure 7B:
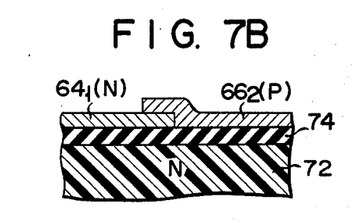

The polysilicon films $64_1$ and $66_2$ may be connected in such a way as illustrated in FIG. 7A or FIG. 7B. In FIGS. 7A and 7B an N type substrate 72 and an oxide film 74 are shown. The oxide film 74 is made of, for example, $SiO_2$ and formed on the N type substrate 72. To form the films $64_1$ and $66_2$ as shown in FIG. 7A, an intrinsic polysilicon film is formed on the oxide film 74. Then, phosphorus or arsenic is difussed into a portion of the intrinsic polysilicon film, thus obtaining the N polysilicon film $64_1$. Baron is then difussed into the remaining portion of the intrinsic polysilicon film, thus forming the P polysilicon film $66_2$. To form the films $64_1$ and $66_2$ as shown in FIG. 7B, the N polysilicon film $64_1$ is first formed on the oxide film 74, and then the P type polysilicon film $66_2$ is formed on the oxide film 74 with its end portion overlapping the N polysilicon film $64_1$.

In FIG. 7B, the P type polysilicon film $66_2$ is formed on the oxide film 74 with its end portion overlapping the N polysilicon film $64_1$. Conversely, the N type polysilicon film $64_1$ may be formed on the oxide film 74 with its end portion overlapping the P polysilicon film $66_2$.

Figure 8:
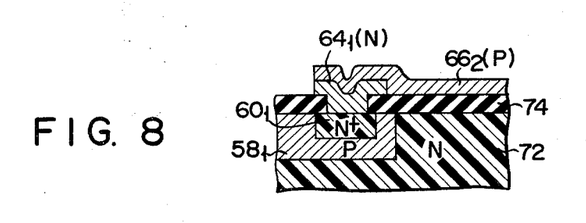
FIG. 8 shows another way of connecting P and N polysilicon films in the device shown in FIG. 6.

In the embodiment of FIG. 6, the N polysilicon film $64_1$ and the P polysilicon film $66_2$ have substantially the same length and extend for some distance from the N+ layer $60_1$ and the P layer $58_2$, respectively. Instead, as shown in FIG. 8, the N polysilicon film $64_1$ may be formed only on the N+ layer $60_1$, and the P polysilicon film $66_2$ may be made long enough to contact the N polysilicon film $64_1$. Conversely, the P polysilicon film $66_2$ may be formed only on the P layer $58_2$, and the N polysilicon film $64_1$ may be made long enough to contact the P polysilicon film $66_2$.

In the embodiment of FIG. 6, the film 69 which connects the injector P layers $62_1$ and $62_2$ is made of P polysilicon. Instead, it may be made of aluminum.

Figure 9A:
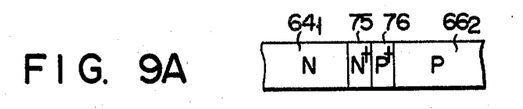
FIGS. 9A to 9G show various connections between a P polysilicon layer and an N polysilicon layer, which reduce forward voltage across the polysilicon layers.
Figure 9B:
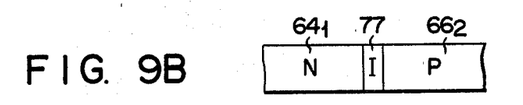
Figure 9C:
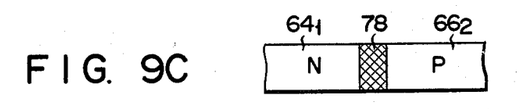
Figure 9D:
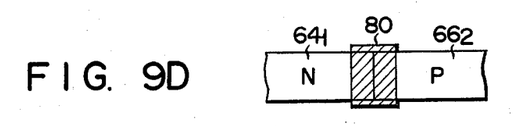
Figure 9E:
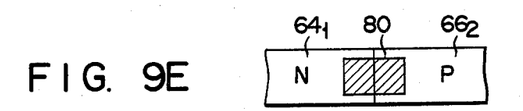
Figure 9F:
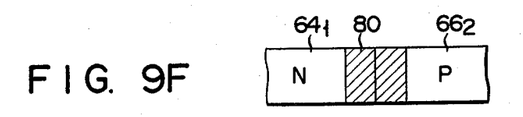
Figure 9G:
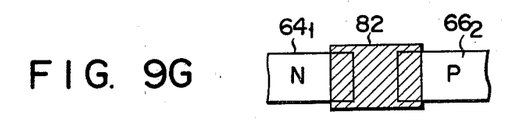

To make the semiconductor device stably function, it is desired that the forward voltage across the PN junction of the polysilicon films $64_1$ and $66_2$ is as small as possible. The forward voltage can be reduced by connecting the polysilicon films $64_1$ and $66_2$ as shown in FIGS. 9A to 9G. More specifically, as shown in FIG. 9A, the abutting end portions of the polysilicon films $64_1$ and $66_2$ are doped with more impurities than the remaining portions, thus forming an N+ region 75 and a P+ region 76. The N+ region 75 and the P+ region 76 thus provided constitute a tunnel diode in the PN junction. Alternatively, as shown in FIG. 9B, between the N polisilicon film $64_1$ and the P polysilicon film $66_2$ an intrisic polysilicon region 77 is interposed, whereby the films $64_1$ and $66_2$ and the region 76 constitute a PIN diode. Further, as shown in FIG. 9C, Ne ions, for example, may be implanted into the PN junction of the polysilicon films $64_1$ and $66_2$, thus forming an amorphous layer 78 and thus destroying the PN junction. As illustrated in FIG. 9D, the PN junction of the polysilicon films $64_1$ and $66_2$ may be covered with a metal silicide film 80 broader than the films $64_1$ and $66_2$, thereby providing a short circuit in the PN junction. The film 80 may be narrower than the films $64_1$ and $66_2$ as shown in FIG. 9E or as broad as the films $64_1$ and $66_2$ as shown in FIG. 9F. The metal silicide film 80 can be formed by laying a metal film having a high melting point, such as platinum film, molybdenum film, tungsten film, titanium film and tantalum film, on the PN junction and then heating the polysilicon films $64_1$ and $66_2$ and the metal film at 500° to 600° C. Alternatively, the metal silicide film 80 may be provided by sputtering metal silicade having a high melting point onto the PN junction. Instead of such a metal silicide film, an aluminum film or other metal films may be used to shortcircuit the PN junction. Still further, as shown in FIG. 9G, the polysilicon films $64_1$ and $66_2$ may be arranged with a gap between them, and they are connected by means of a metal silicide film 82 or an aluminum film 82. The film 82 may be broader than the films $64_1$ and $66_2$ as shown in FIG. 9G. Alternatively, it may be as broad as the films $64_1$ and $66_2$ or narrower than these film.

Such a tunnel diode as shown in FIG. 9A and such a PIN diode as shown in FIG. 9B effectively reduce the forward voltage across the PN junction particularly when the P polysilicon film $66_2$ overlaps the N polysilicon film $64_1$ as illustrated in FIG. 7B and FIG. 8.

If platinum is used in order to provide a short circuit in the PN junctions of the N polysilicon films and the P polysilicon films, only that portion of the platinum film which is laid on the oxide film 74 can be successfully removed by aqua reia boiling process. This makes it possible to form platinum silicide films exclusively on the polysilicon films $64_1$, $64_2$, $66_1$, $66_2$ and 69, without a mask-aligning process. In practice, the platinum silicide films are formed in the following way.

Figure 10A:
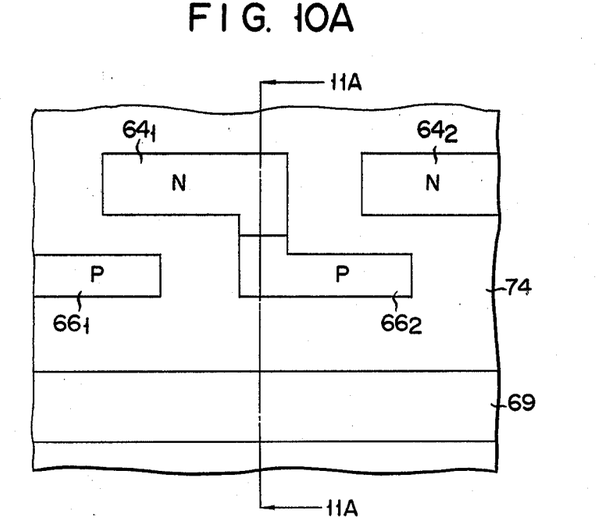
FIGS. 10A to 10C illustrate the forming of films of a metal silicide on the P polysilicon layers and N polysilicon layers of a semiconductor device according to this invention.
Figure 10B:
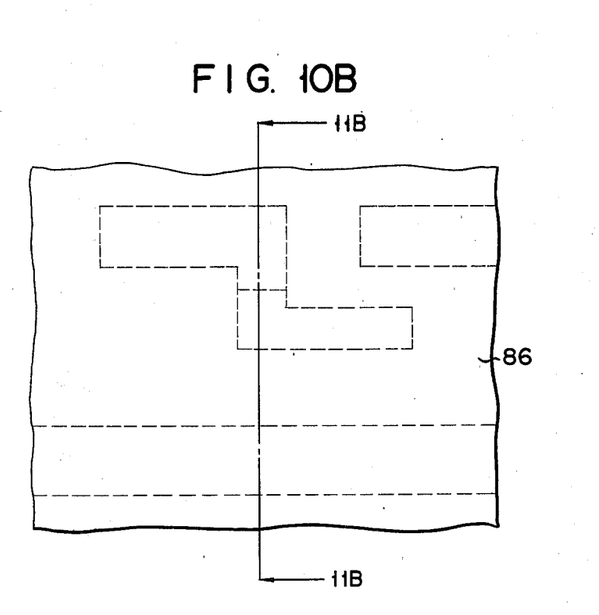

First, such a circuit as shown in FIG. 10A is prepared. The circuit consists of a semiconductor substrate and an oxide film 74, N polysilicon films $64_1$ and $64_2$, P polysilicon films $66_1$ and $66_2$ and a P polysilicon film 69; all formed on the substrate. Then, as shown in FIG. 10B, a platinum film 86 is formed on the entire surface of the circuit board. Thereafter, the circuit board with the film 86 formed on it is heated at a temperature of 450° C. to 800° C. until platinum silicide films are formed on the polysilicon films $64_1$, $64_2$, $66_1$, $66_2$ and 69. The circuit board is then put into a aqua regia bath and boiled until that portion of the platinum film which lies on the oxide film 74 is removed. As a result, as shown in FIG. 10C, platinum silicide films $88_1$, $88_2$, $88_3$, $88_4$ and $88_5$ are formed respectively on the polysilicon films $64_1$, $64_2$, $66_1$, $66_2$ and 69, in self-alignment process.

Figure 10C:
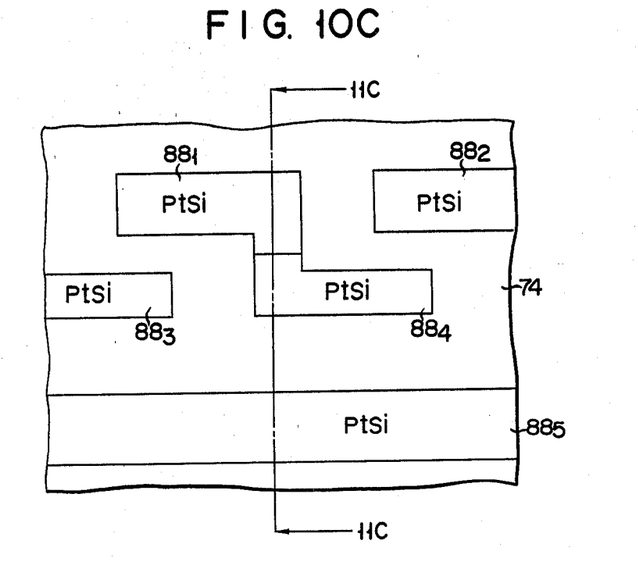
Figure 11A:
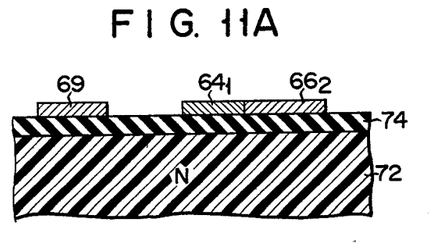
FIGS. 11A to 11C are cross sectional views taken along line 11A—11A in FIG. 10A, line 11B—11B in FIG. 10B and line 11C—11C in FIG. 10C.
Figure 11B:
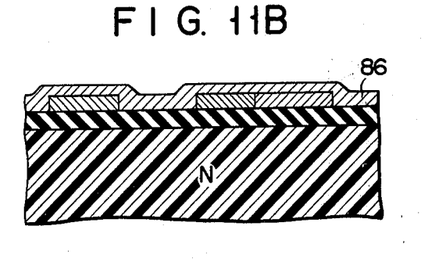
Figure 11C:
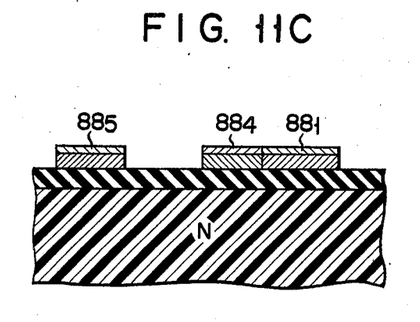

FIGS. 11A, 11B and 11C are cross sectional views taken along line 11A—11A in FIG. 10A, line 11B—11B in FIG. 10B and line 11C—11C in FIG. 10C, respectively. Since the platinum silicide films $88_1$ to $88_5$ are self-aligned respectively with the polysilicon films $64_1$, $64_2$, $66_1$, $66_2$ and 69 as shown in FIG. 11C. Thus, it is easy to provide a short circuit in the PN junctions of the P polysilicon films and the N polysilicon films.

Further, since the platinum silicide films $88_1$ to $88_5$ are formed on the entire surfaces of the polisilicon films $64_1$, $64_2$, $66_1$, $66_2$ and 69, the these films have the sheet resistance about ten times lower than that of an only polisilicon film.

If molybdenum, tungsten, titanium or tentalum is used instead of plutinum in order to provide a short circuit in the PN junctions of the N polysilicon films and the P polysilicon films, molybdenum silicide films are formed on the polysilicon films $64_1$, $64_2$, $66_1$, $66_2$ and 69 substantially in the same way as illustrated in FIGS. 10A, 10B and 10C and FIGS. 11A, 11B and 11C.

Figure 12:
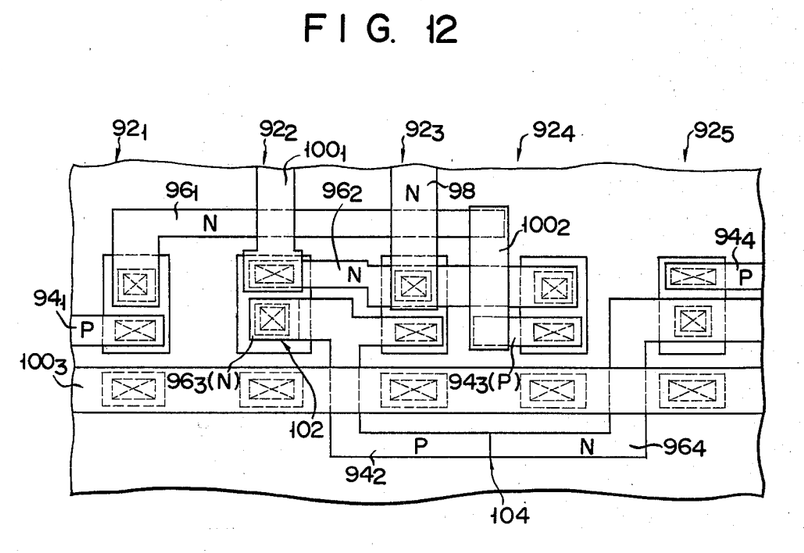
FIG. 12 is an electrode pattern of a logic circuit including a plurality of IIL gates.

In the above-described embodiment, the electrode film $64_1$ which contacts the N layer $60_1$ (i.e. signal output terminal) is made of N polysilicon, and the electrode film $66_2$ which contacts the P layer $58_2$ (i.e. signal input terminal) is made of P polysilicon. Instead, both electrode films $64_1$ and $66_2$ may be made of polysilicon of the same conductivity type, either P type or N type. If both films $64_1$ and $66_2$ are made of P polysilicon, they form at the N layer $60_1$ a PN junction which consists of P polysilicon and N single-crystalline silicon. To reduce the forward voltage across this PN junction, it is sufficient to form in the PN junction such a tunnel diode as shown in FIG. 9A or such a PIN diode as shown in FIG. 9B. On the other hand, if both films $64_1$ and $66_2$ are made of N polysilicon film, they form at the P layer $58_2$ a PN junction consisting of P single-crystalline silicon and N polysilicon. FIG. 12 is an electrode pattern of a logic circuit which comprises a semiconductor substrate, a plurality of IIL gates formed in the substrate and polysilicon films formed on the substrate in multilayer process. For simplicity's sake only five IIL gates $92_1$, $92_2$, $92_3$, $92_4$ and $92_5$ are illustrated. P polysilicon films $94_1$, $94_2$, $94_3$ and $94_4$ are formed on the substrate. N polysilicon films $96_1$, $96_2$, $96_3$ and $96_4$ are formed also on the substrate. Further, an N polysilicon film 98 is formed connecting to the N polysilicon film $96_2$. Still further, aluminum films $100_1$, $100_2$ and $100_3$ are provided. The aluminum film $100_1$ connects to the N polysilicon film $96_2$, the aluminum film $100_2$ connects to the P polysilicon film $94_3$ and the N polysilicon film $96_1$. An insulation film is provided between the N polysilicon film 98 on one hand and the polysilicon films $94_1$ to $94_4$ and $96_1$ to $96_4$ on the other hand. Another insulation film is provided between the N polysilicon film 98 on one hand and the aluminum films $100_1$ to $100_3$ on the other hand. These insulation films are not shown in FIG. 12 for simplicity's sake.

The N polysilicon film $94_2$ overlaps the P polysilicon film $96_3$ to form a PN junction 102 in such a manner as shown in FIG. 8. The N polysilicon film $94_2$ and the P polysilicon film $96_4$ are connected to form a PN junction 104 in such a manner as shown in FIG. 7A or FIG. 7B. At the input terminal in the IIL gate $92_1$, the PN junction consists of N polysilicon film $96_2$ and diffused P conductivity single crystalline silicon. Through these PN junctions current flows always in the forward direction. The forward votlage across the PN junctions is small and will not much affect the operation of the logic circuit. To reduce the forward voltage across the PN junctions and thus to make the logic circuit operate stably, a tunnel diode or a PIN diode may be formed in these PN junctions.

Since most of the electrode films are made of polysilicon, they are easily formed one upon another, thus providing a multilayer structure. The electrode films therefore occupy a smaller area than otherwise, whereby the packing density of the logic circuit is increased. The multilayer structure of electrode films is advantageous because various logic circuits may be manufactured merely by arranging the electrode films in various patterns, without changing the arrangement of the IIL gates.

As mentioned above, this invention uses polysilicon to form the electrode films of a semiconductor device including a plurality of bipolar transistors such as IIL gates, wherein current flows through the electrode films always from P semiconductor layers to N semiconductor layers. Its electrode films being made of polysilicon, the semiconductor device has its packing density increased and can be designed more easily than otherwise.

All the embodiments mentioned above are semiconductor devices comprising IIL gates. This does not mean that the invention is limited to IIL gates. This invention may be applied to other types of semiconductor devices comprising bipolar transistors if the forward voltage across the PN junctions of P and N polysilicon films and the voltage drop in each polysilicon film are reduced to proper values.

What we claim is:

1. A semiconductor device comprising:
   a semiconductor substrate;
   an integrated circuit having a plurality of bipolar transistors formed in the substrate, each transistor including a diffusion layer of P conductivity type and a diffusion layer of N conductivity type;
   a polysilicon film of P conductive type formed as an electrode on the diffusion layer of P conductivity type of each transistor:
   a polysilicon film of N conductivity type formed as an electrode on the diffusion layer of N conductivity type of each transistor;
   a P-N junction formed between the P and N polysilicon films; and
   a PIN diode formed at the P-N junction.

2. A semiconductor device according to claim 1, wherein said bipolar transistors constitute integrated injection logic gates, each gate comprising a vertical bipolar transistor inverter of a first conductivity type and a lateral bipolar transistor injector of a second conductivity type, an emitter region of the vertical transistor and a base region of the lateral transistor comprising a first common region and a base region of the vertical transistor and a collector region of the lateral transistor comprising a second common region.

3. A semiconductor device comprising:
   a semiconductor substrate;
   an integrated circuit having a plurality of bipolar transistors formed in the substrate, each transistor including a diffusion layer of P conductivity type and a diffusion layer of N conductivity type;
   a polysilicon film of P conductivity type formed as an electrode on the diffusion layer of P conductivity type of each transistor;
   a polysilicon film of N conductivity type formed as an electrode on the diffusion layer of N conductivity type of each transistor; and
   an amorphous portion provided between the P and N polysilicon films and connecting the P and N polysilicon films.

4. A semiconductor device according to claim 3, wherein said bipolar transistors constitute integrated injection logic gates, each gate comprising a vertical bipolar transistor inverter of a first conductivity type and a lateral bipolar transistor injector of a second conductivity type, an emitter region of the vertical transistor and a base region of the lateral transistor comprising a first common region and a base region of the vertical transistor and a collector region of the lateral transistor comprising a second common region.

* * * * *

UNITED STATES PATENT AND TRADEMARK OFFICE
CERTIFICATE OF CORRECTION

PATENT NO. : 4,412,239

DATED : October 25, 1983

INVENTOR(S) : HIROSHI IWASAKI ET AL.

It is certified that error appears in the above—identified patent and that said Letters Patent is hereby corrected as shown below:

Claim 1, line 7, change "conductive" to --conductivity--.

Signed and Sealed this

Twelfth Day of June 1984

[SEAL]

Attest:

GERALD J. MOSSINGHOFF

Attesting Officer     Commissioner of Patents and Trademarks